United States Patent [19]

Burgess et al.

[11] 4,152,175
[45] May 1, 1979

[54] SILICON SOLAR CELL ASSEMBLY

[75] Inventors: Edward L. Burgess; Robert D. Nasby; Donald G. Schueler, all of Albuquerque, N. Mex.

[73] Assignee: The United States of America as represented by the United States Department of Energy, Washington, D.C.

[21] Appl. No.: 927,236

[22] Filed: Jul. 24, 1978

[51] Int. Cl.$^2$ .............................................. H01L 31/04
[52] U.S. Cl. .................................. 136/89 PC; 357/81
[58] Field of Search ......... 136/89 CA, 89 PC, 89 SA; 357/30, 81

[56] References Cited

U.S. PATENT DOCUMENTS

| | | | |
|---|---|---|---|
| 2,989,575 | 6/1961 | Wallace, Jr. | 136/89 |
| 3,005,862 | 10/1961 | Escoffery | 136/89 |
| 3,268,366 | 8/1966 | Guyot | 136/89 |
| 3,346,419 | 10/1967 | Webb et al. | 136/89 |
| 3,769,091 | 10/1973 | Leinkram et al. | 136/89 |
| 3,833,425 | 9/1974 | Leinkram et al. | 136/89 |
| 3,837,924 | 9/1974 | Baron | 136/89 |
| 3,860,949 | 1/1975 | Stoeckert et al. | 357/65 |
| 4,104,676 | 8/1978 | Bednorz et al. | 357/79 |
| 4,118,249 | 10/1978 | Graven et al. | 136/89 PC |

*Primary Examiner*—Aaron Weisstuch
*Attorney, Agent, or Firm*—Dean E. Carlson; Dudley W. King; Robert Southworth, III

[57] ABSTRACT

A silicon solar cell assembly comprising a large, thin silicon solar cell bonded to a metal mount for use when there exists a mismatch in the thermal expansivities of the device and the mount.

6 Claims, 3 Drawing Figures

SILICON SOLAR CELL ASSEMBLY

FIELD OF THE INVENTION

The invention relates to a silicon solar cell bonded to a metal mount.

BACKGROUND OF THE INVENTION

Large, thin silicon devices such as solar cells or high power rectifiers must often be bonded to a metal mount in a manner that provides for good thermal and electrical conductivity. It is well known in the art that such bonding may be performed by utilizing an adhesive or by utilizing solder.

Both of these methods suffer from the inability to cope with a mismatch in the linear thermal coefficient of expansion between the silicon and the metal mount. It has been shown (D. L. Olson and K. M. Koliwad, *Large Silicon Slice Mounting*, IEEE Transactions on Parts, Hybrids, and Packaging, Vol. PHP-7, No. 2, June 1971) that the maximum area of a large silicon slice which may be mounted on a substrate is inversely related to differences in the coefficients of thermal expansion and the change in temperature.

In advanced solar cell systems, mirrors or lenses are used to concentrate sunlight on the silicon photovoltaic cells to levels as high as 100 suns. This high light intensity magnifies the problem of material mismatch between the silicon cell and the metal mounting block.

In earlier, nonconcentrating, solar cell arrays each cell has been mounted either directly on a mounting block or on a single pedestal with flexible interconnects between cells. This practice is exemplified by U.S. Pat. Nos. 2,989,575; 3,769,091; 3,833,425; and 3,837,924. This earlier practice provides for thermal expansion between cells but not for thermal expansion within a single cell.

SUMMARY OF THE INVENTION

In view of the difficulties and disadvantages as noted above, it is an object of this invention to provide a novel structure for a large, thin silicon solar cell bonded to a metal mount.

It is a further object of this invention to provide a bonding method which allows for a mismatch in the coefficients of thermal expansion between a silicon solar cell and a metal mount.

It is a still further object of this invention to provide good thermal and electrical contact between a silicon solar cell and a metal mount.

The invention comprises an improved solar cell assembly wherein a large, thin silicon solar cell is bonded to a metal mount by providing a large number of small pedestals on the top surface of the metal amount and soldering the silicon device to the tops of the pedestals.

BRIEF DESCRIPTION OF THE DRAWINGS

Other objects and advantages of the present invention will be apparent to those skilled in the art from the following description with reference to the appended claims wherein like numbers denote like parts and wherein:

DESCRIPTION OF THE PREFERRED EMBODIMENT

Figure 1:
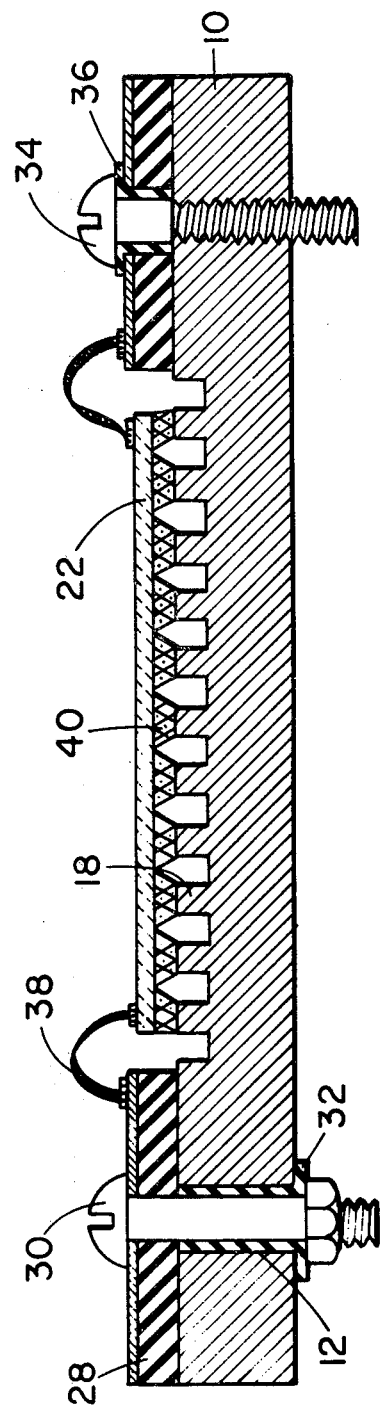
FIG. 1 illustrates in cross section the silicon solar cell assembly of the present invention.

Reference is now made to FIG. 1 which illustrates the solar cell assembly of the present invention in cross section. A metallic mounting block 10 is provided with a multiplicity of pedestals 18 on its top surface. The metallic mounting block preferably possesses good electrical and thermal conductivity and good solderability such as that exhibited by copper, silver, and iron based alloys. With a block of copper, pedestals having a top surface area of about 0.0006 square inch and a height to width ratio of at least 2.5 have been found to be satisfactory.

A silicon solar cell 22 having a solderable back surface is affixed to the tops of the pedestals using solder 40 and as further described hereinbelow. A member having a conductive top surface and an insulating bottom surface, such as a copper faced printed circuit board 28, may be affixed to the top of the mounting block 10 such that it covers substantially all of the top surface of the mounting block which is not covered by the silicon solar cell. Electrical connection between the top surface of the silicon solar cell and the top surface of the printed circuit board may be made by soldering the ends of a metal braid 38 to each.

It may be convenient to attach the printed circuit board to the mounting block using bolts 30 and 34 and mounting holes 12. Through the use of appropriate electrical insulating sleeves 32 and 36, the first mentioned bolt may be used as a binding post for electrical connection with the top surface of the solar cell and the second mentioned bolt may be used as a binding post for electrical connection with the bottom surface of the solar cell.

Figure 2:
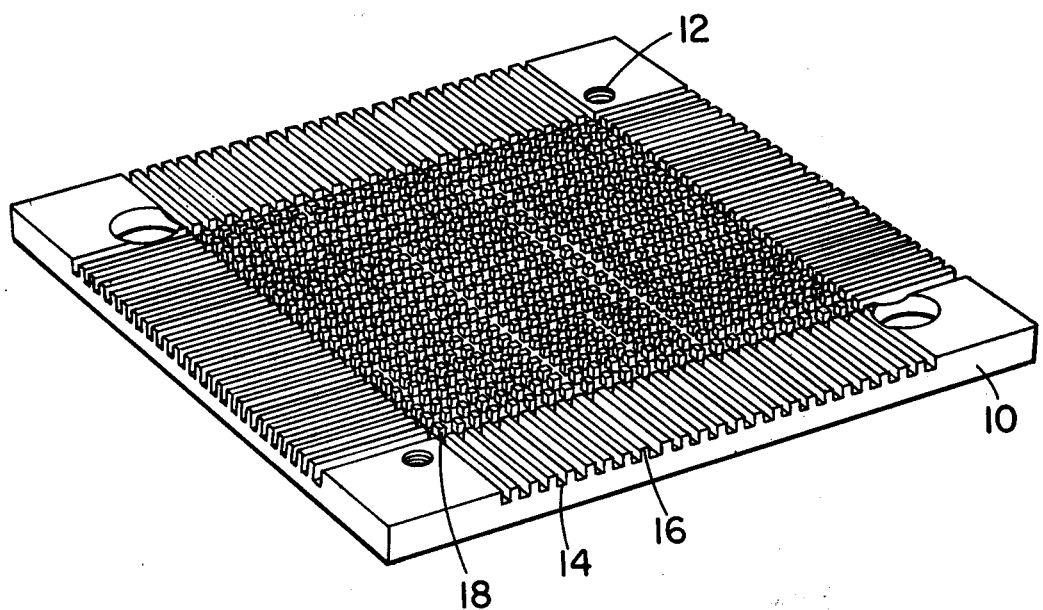
FIG. 2 illustrates in perspective the mounting plate of the present invention.

Reference is now made to FIG. 2 which illustrates in perspective a mounting block 10 prepared for use with this invention. It has been found that with a silicon solar cell of 0.012 inch thickness and two inches diameter, a mounting block three inches square and 0.125 inch thick is satisfactory. The sum of the areas of the support surfaces is about 40% of the area of the underside of the silicon solar cell. Because of their good thermal and electrical conductivity and solderability, copper alloys may be used for the material of the mount. As would be apparent to those skilled in the art, other alloys such as iron-based alloys which are good conductors of heat and electricity and which are solderable may be substituted for copper.

Mounting holes 12 or the like may be conveniently placed in the corner areas of the block as these will contain neither pedestals nor the silicon solar cell. Within the central area of the block, a large number of pedestals 18 are provided. One method for providing these pedestals is to gang-saw two sets of parallel grooves 14 into the surface, leaving a ridge 16 between each pair of grooves. Where each set of grooves intersect, a large number of pedestals are created. Those skilled in the art will recognize that other metal forming techniques including machining, forging, or casting could be used to create the pedestals.

By using a large number of small pedestals, it is felt that the pedestals are free to flex to accommodate differential thermal expansion between the copper block and the silicon solar cell while at the same time providing for good electrical and thermal contact. Furthermore, as the pedestal tops comprise a significant fraction of the mounting surface, the electrical and thermal conductivities approach that of a solid copper block.

Figure 3:
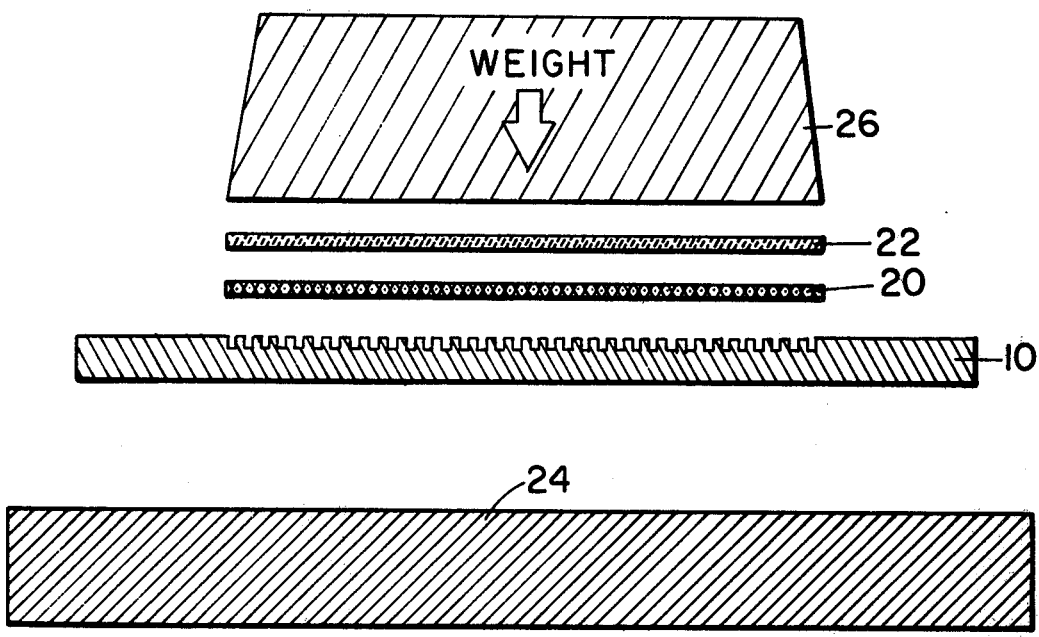
FIG. 3 illustrates in exploded view the components of the invention undergoing bonding.

Reference is now made to FIG. 3 which illustrates in exploded view the components undergoing bonding. The mounting block 10 and a silicon solar cell 22 are first coated on opposing surfaces with a noncorrosive rosin type solder flux, the silicon solar cell being of the type with a solderable rear surface. A disk of solder 20 is placed between the cell and the block, the block is placed on a hot plate 24 and a weight 26 is placed on top of the silicon solar cell to urge the two together as the solder is melted by the heat of the hot plate. The assembly is then allowed to cool and the silicon solar cell will be bonded to the block.

With a silicon solar cell having a silvered rear surface and with a copper mounting block, a two inch disk of 50—50 lead-in solder with 5% silver added and about 0.005 inch thick was found to produce a satisfactory bond.

EXAMPLE

A large silicon solar cell having a diameter of two inches and a thickness of 0.012 inch was mounted on a copper block with good electrical and thermal contact using the following procedure.

Pedestals were produced on a copper block three inches square and 0.125 inch thick by gang-sawing two mutually perpendicular sets of parallel grooves into a face of the copper block. Each set contained 50 grooves, and each groove was 0.016 inch wide and 0.062 inch deep. This produced on the surface of the block 2401 pedestals each 0.025 inch square and 0.062 inch high.

Noncorrosive rosin type solder flux was applied to the pedestal surface of the copper block and to the silvered back surface of the silicon soler cell. A two inch diameter by 0.005 inch thick disk of 50—50 lead-zinc sheet solder containing 5% silver was placed between the silicon cell and the copper block. The entire assemblage was placed on a hot plate with the copper block side down. A two pound weight was placed upon the solar cell and the hot plate was heated until the solder was observed to melt. The soldered assemblage was then cooled before removing the weight.

The system was temperature cycled between −65° and +165° F. to test the adequacy of construction. In addition, the structure was temperature shock tested by alternately plunging in boiling and ice water. No visible damage to the cell, structure, or bond occurred.

We claim:

1. A silicon solar cell assembly comprising a metallic support block of good thermal and electrical conductivities having projecting therefrom a multiplicity of discrete pedestals with upper ends providing a multiplicity of support surfaces and each pedestal with its associated support surface being spaced from the others entirely about its circumference, a silicon solar cell having an underside supported on said support surfaces of the pedestals and spanning the spaces between the pedestals, and means fixedly securing said pedestal support surfaces to correspondingly spaced apart areas at the underside of said silicon solar cell whereby stress and strain in said silicon solar cell due to thermal expansions and contractions of said silicon solar cell and metal support block are accommodated and cracking of the silicon solar cell minimized.

2. The silicon solar cell assembly of claim 1 wherein the metallic support block is comprised of copper.

3. The silicon solar cell assembly of claim 1 wherein the pedestals have a height to width ratio of at least 2.5.

4. The silicon solar cell assembly of claim 1 wherein the sum of the areas of the support surfaces is about 40% of the area of the underside of the silicon solar cell.

5. The invention of claim 1 wherein the pedestals are provided by forming a plurality of intersecting grooves in a surface of the metallic support block and each pedestal has a top surface area of about 0.0006 square inch, a height of about 0.06 inch, and separated from adjacent pedestals by about 0.016 inch.

6. The silicon solar cell assembly of claim 1 wherein the means for fixedly securing the silicon solar cell comprises solder applied by placing a sheet of solder between the underside of the silicon solar cell and the support surfaces of the pedestals and then simultaneously applying heat and pressure.

* * * * *